United States Patent
Ono et al.

(10) Patent No.: US 7,678,512 B2
(45) Date of Patent: *Mar. 16, 2010

(54) METHOD OF MAKING A GRAYSCALE RETICLE USING STEP-OVER LITHOGRAPHY FOR SHAPING MICROLENSES

(75) Inventors: Yoshi Ono, Camas, WA (US); Bruce D. Ulrich, Beaverton, OR (US); Wei Gao, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 506 days.

This patent is subject to a terminal disclaimer.

(21) Appl. No.: 11/657,326

(22) Filed: Jan. 24, 2007

(65) Prior Publication Data

US 2008/0176148 A1 Jul. 24, 2008

(51) Int. Cl.
*G03F 1/00* (2006.01)
(52) U.S. Cl. .......................... 430/5; 438/717
(58) Field of Classification Search .................. 430/5, 430/321; 359/619; 438/455, 700, 34, 48, 438/717
See application file for complete search history.

(56) References Cited

U.S. PATENT DOCUMENTS

| | | | |
|---|---|---|---|
| 5,536,455 A | 7/1996 | Aoyama et al. | |
| 6,071,652 A * | 6/2000 | Feldman et al. | 430/5 |
| 6,221,687 B1 | 4/2001 | Abramovich | |
| 6,473,238 B1 | 10/2002 | Daniell | |
| 7,068,432 B2 | 6/2006 | Boettiger et al. | |
| 7,078,260 B2 | 7/2006 | Jeon | |
| 2005/0118788 A1 * | 6/2005 | Kuwahara et al. | 438/455 |
| 2005/0170655 A1 * | 8/2005 | Bencher et al. | 438/700 |
| 2006/0183027 A1 * | 8/2006 | Lin et al. | 430/5 |
| 2008/0197107 A1 * | 8/2008 | Gao et al. | 216/12 |

OTHER PUBLICATIONS

U.S. Appl. No. 11/588,891, filed Oct. 27, 2006, Ono et al.

* cited by examiner

*Primary Examiner*—Mark F Huff
*Assistant Examiner*—Stewart A Fraser
(74) *Attorney, Agent, or Firm*—Law Office of Gerald Maliszewski; Gerald Maliszewski

(57) ABSTRACT

A method of fabricating a grayscale reticle includes preparing a quartz wafer substrate; depositing a layer of SRO on the top surface of the quartz substrate; patterning and etching the SRO to form an initial microlens pattern using step-over lithography; patterning and etching the SRO to form a recessed pattern in the SRO; depositing an opaque film on the SRO; patterning and etching the opaque film; depositing and planarizing a planarizing layer; cutting the quartz wafer into rectangular pieces sized to be smaller than a selected blank reticle; bonding the a piece a to selected reticle blank to form a grayscale reticle; and using the grayscale reticle to form a microlens array on a photoimager.

13 Claims, 6 Drawing Sheets

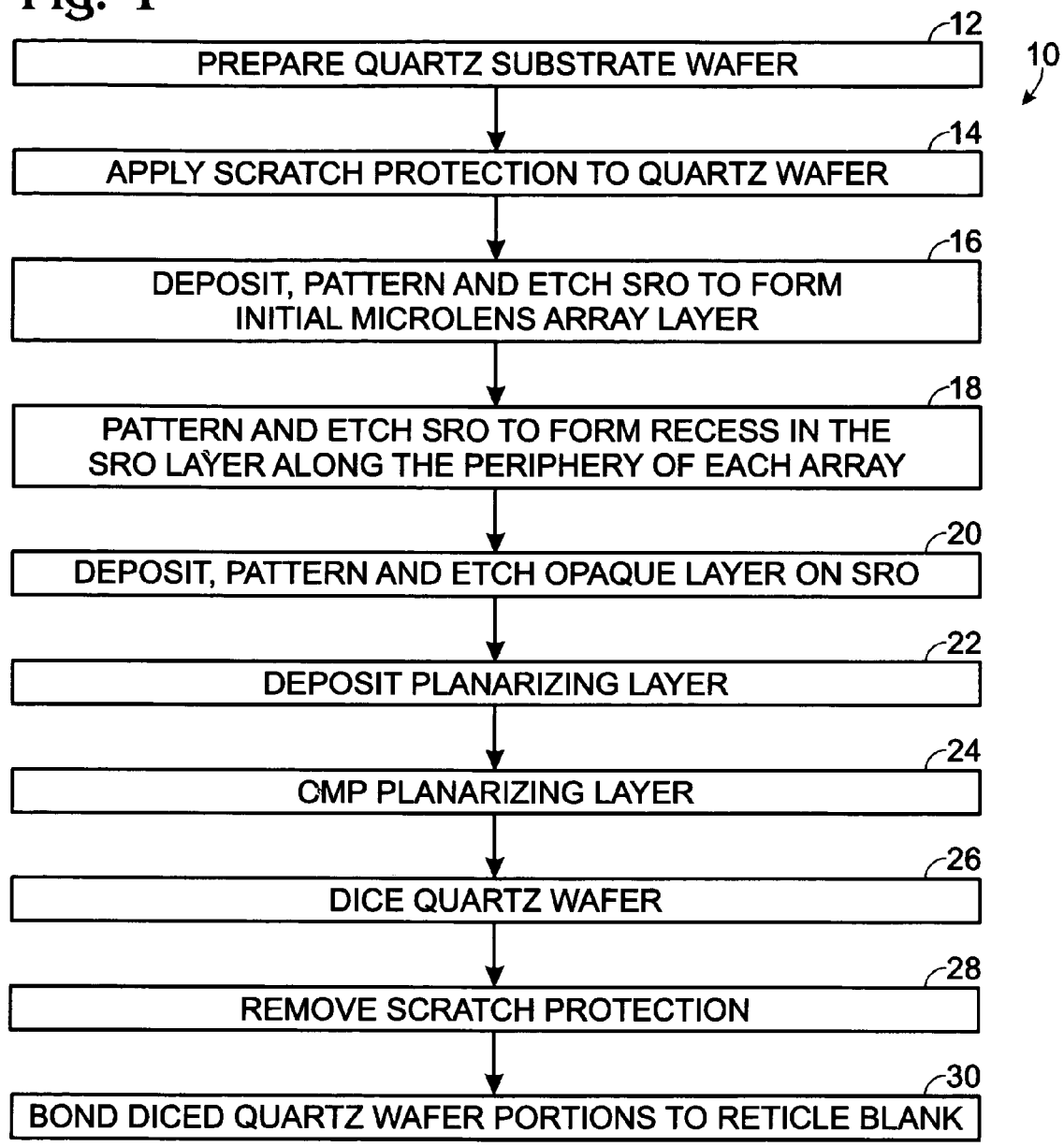
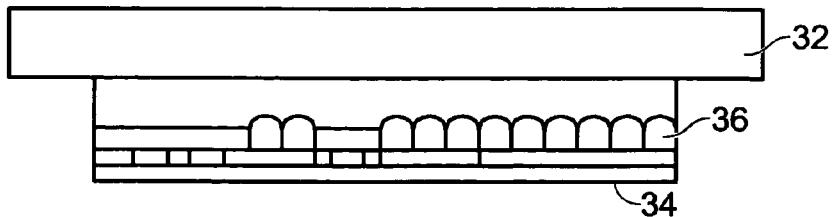

Fig. 12

TRANSMITTANCE VS SRO THICKNESS OF TWO DIFFERENT FILMSTACKS

METHOD OF MAKING A GRAYSCALE RETICLE USING STEP-OVER LITHOGRAPHY FOR SHAPING MICROLENSES

FIELD OF THE INVENTION

This invention relates to image sensors, and specifically to provision of an image sensor having a near 100% fill factor in a microlens array.

BACKGROUND OF THE INVENTION

To obtain high quality images from cameras, it is desirable to collect as much light from a scene as possible. It is desirable to channel the light impinging the surface of an image sensor to an active pixel element for maximum detection and signal strength. Known image sensors do not have a fill factor (FF) of close to 100% in their microlens arrays. The FF is defined as the ratio of the amount of area from which light is collected and detected to the area of the image sensor.

There are two known methods used to form light concentrating elements called microlenses. The most common method is to expose and develop cylindrical patterns of photoresist, using one cylinder per unit cell. A photoresist reflow is performed to change the cylinder to a hemisphere. The reflow uses a time/temperature combination to melt the photoresist. A typical condition used is 60 seconds at 170° C. The fill factor using this technique is limited to approximately 78%, because the footprint of the hemispherical shape is circular, and, because a square array of microlenses is desired, thus, there are unused areas at the unit cell corners. This is a problem of fitting circles in squares. This is a cost effective method of forming a microlens, yet it lacks the ability to collect all the available light.

The other method is using a grayscale mask directly to pattern the photoresist, without using a reflow process. In this method, the photomask used is a special grayscale photomask. U.S. Pat. No. 6,562,523 B1, granted May 13, 2003, to Wu et al. for Direct write all-glass photomask blanks, and U.S. Pat. No. 6,524,756 B1, granted Feb. 25, 2003, to Wu for Grayscale all-glass photomasks describe these processes. The photomask described in the patents is essentially planar. A layer of about 1 μm in thickness, of zinc silicate, is exposed by an electron beam, which converts the transmission property, making the layer more opaque, depending on the electron beam dose. By making each of the microlenses of varying transmittances the resultant shape after expose and development is a true 100% fill factor of the desired shape. The problem with this method is the high cost of the photomask, which is too expensive for practical commercial use. This is because the process of making the photomask is a serial one, i e., exposing each microlens in succession to multiple doses of the electron beam.

U.S. Pat. No. 5,536,455, granted Jul. 16, 1996, to Aoyama et al. for Method of manufacturing lens array describes combination of plural lens-base elements.

U.S. Pat. No. 6,221,687 B1, granted Apr. 24, 2001, to Abramovich for Color image sensor with embedded microlens array describes use of a $Si_xN_y$ layer and reactive ion etching thereof to from a microlens array.

U.S. Pat. No. 6,473,238 B1, granted Oct. 29, 2002, to Daniell for Lens Arrays describes a lens array having air gaps therein.

U.S. Pat. No. 7,068,432 B2, granted Jun. 27, 2006, to Boettiger et al. for Controlling lens shape in microlens array describes adjusting melting properties of microlens material.

U.S. Pat. No. 7,078,260 B2, granted Jul. 18, 2006, to Jeon for CMOS image sensors and methods for fabricating the same describes a lens array wherein the lenses have a substantially flattened top surface.

U.S. patent application Ser. No. 11/588,891, filed Oct. 27, 2006, of Ono et al., for Grayscale Reticle for Precise Control of Photoresist Exposure, describes use of a low-cost technique for fabricating a grayscale mask for use in IC lithographic processes.

SUMMARY OF THE INVENTION

A method of fabricating a grayscale reticle includes preparing a quartz wafer substrate; depositing a layer of SRO on the top surface of the quartz substrate; patterning and etching the SRO to form an initial microlens pattern using step-over lithography; depositing and planarizing a transparent layer having a refractive index matched to that of the SRO; cutting the quartz wafer into pieces which will fit within the area of the selected reticle blank; bonding the pieces to selected reticle blanks to form a grayscale reticle; and using the grayscale reticle to form a microlens array on a photosensor.

During actual production, opaque regions are required in addition to the grayscale regions, which requires additional process steps. A blank quartz wafer is prepared; a layer of SRO is deposited on the top surface of the quartz wafer; the SRO is patterned and etched to form the microlens array(s) using step-over lithography in array regions; The SRO in the peripheral areas is patterned and etched where opaque regions are desired; an opaque film is deposited on the SRO, patterned and etched; a planarizing layer is deposited and planarized; cutting the quartz wafer into pieces which will fit within the area of the selected reticle blank; bonding the pieces to selected reticle blanks to form a grayscale reticle; and using the grayscale reticle to form a microlens array on a photosensor.

It is an object of the invention to provide a microlens array having a near 100% fill factor.

It is another object of the method of the invention to provide a technique for fabrication of a quartz-based reticle.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 is a block diagram of the method of the invention.

FIG. 2 depicts a cross-sectional view of the grayscale reticle.

FIG. 12 is a graph depicting transmittances vs SRO thickness.

DETAILED DESCRIPTION OF THE PREFERRED EMBODIMENTS

Figure 3:
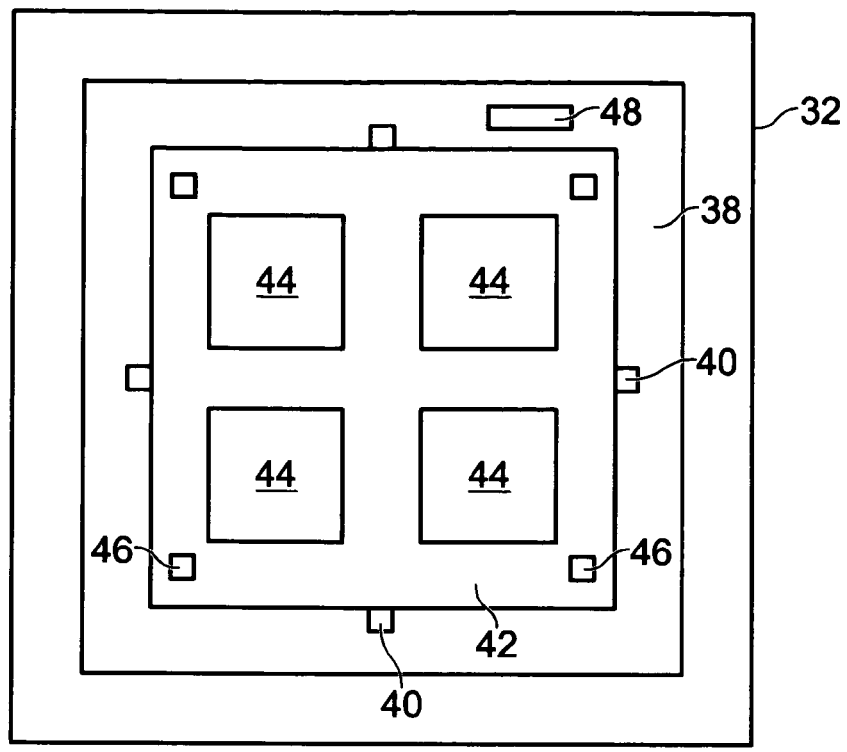
FIG. 3 depicts a top plan view of the grayscale reticle.
Figure 4:
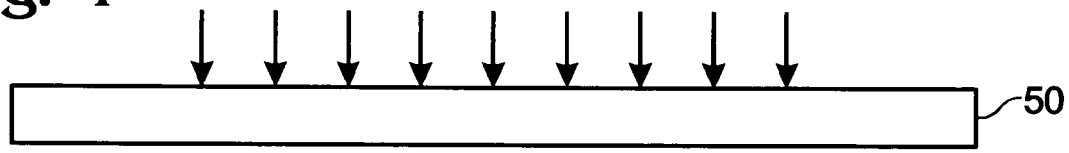
FIGS. 4-7 depict a process sequence of the method of the invention.
Figure 5:
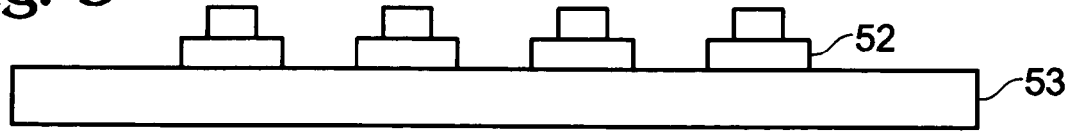
Figure 6:
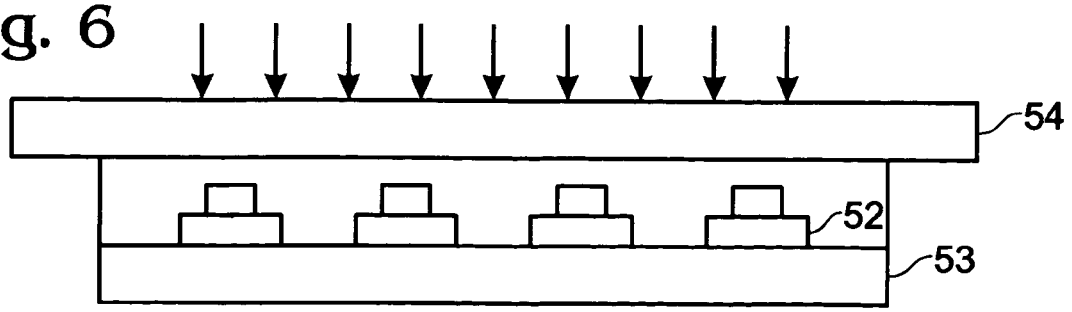
Figure 7:
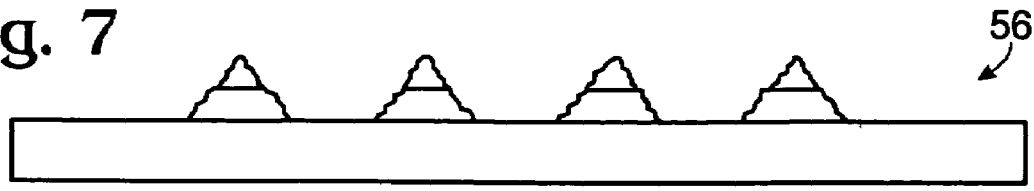

In the method of the invention, a layer of silicon rich oxide (SRO) is used as a partially transmitting layer. The thickness of the SRO is varied to control the exposure of the photoresist. Three-dimensional structures are fabricated by patterning and etching the SRO film. The initial film thickness is approximately 0.75 μm, and is deposited on a quartz (Qz) wafer which is used as the substrate.

A method of fabricating a grayscale reticle specifically for the purpose of generating microlens arrays having a pitch less than 5 μm and larger than 1 μm is disclosed. A typical microlens has a convex surface, typically having a parabolic or hemispherical functional form, so that light hitting anywhere on the lens is refracted at the surface, which has an index of refraction change, and is deflected towards the active region of a photodetector. The formation of the parabolic or hemispheric shape in photoresist is enabled using a grayscale mask that varies the transmission of the light which exposes the photoresist in a controlled fashion as to generate the desired shape in three dimensions.

A near 100% fill factor (FF) may be achieved using the method of the invention, which also provides a cost effective process to achieve this high fill factor. The invention is not limited to making microlenses. The invention controls the shape of the resultant photoresist pattern to a desired shape, which may be used to pattern structures other than microlens arrays. The invention provides a general method to form microlenses of either symmetric or non-symmetric shapes.

By patterning the SRO, or absorptive, film, the transmission may be varied as a function of its thickness, and by using a transparent indexed matched film to that of the SRO film, e.g., matching the real components of the refractive index of each material, there is no generation of interference effects, and no refraction of the light. The result is a true grayscale photomask.

Initially, on a parent photomask, an array of various sized patterns, all on the same lens pitch, is designed, which produce a microlens array using a conventional binary photomask, made of Cr/CrO and quartz. The Cr/CrO film blocks all the light, while the quartz areas allow the light to pass through the photomask. This parent photomask, commonly called a reticle, or parent reticle, is not the invention's grayscale reticle, but is used to produce the grayscale reticle of the invention. The grayscale reticle is then used to produce the microlens arrays in a CMOS or CCD IC process. By superpositioning various sized patterns using the parent reticle, at predetermined exposures, a composite of exposed concentric patterns produces a desired photoresist shaped pattern. It is this pattern that is used to produce a microlens array.

Referring now to FIG. 1, the method of the invention is depicted generally at 10. The first step is preparation of a quartz (Qz) wafer 12 for use as a substrate. The quartz wafer substrate has the same physical SEMI standard dimensional specifications as a silicon wafer.

Scratch protection is applied 14 to the quartz wafer. Because the top and bottom surfaces of the finished quartz substrate, after dicing and bonding, are to be optical surfaces, no defects may be present. This includes scratches and particles which affect the light path during exposures of the grayscale photomask. The scratch protection layer may include oxides, nitrides, polyimides, metals or any other material that can be removed without affecting the quartz substrate's optical properties. This scratch protection may or may not be used, however, in the preferred embodiment, scratch protection is applied to the top, or frontside, and bottom, or backside, surfaces of the quartz substrate, sequentially, first to the top surface and then to the bottom surface. The top side scratch protection is then removed, however, it serves to protect the surface during deposition of the bottom, or back, scratch protection material.

The scratch protection process may include: evaporative deposition of a titanium film to the front, using manual handling so that only the edges are vulnerable to scratches; evaporative deposition of a titanium film to the backside of the quartz wafer, again using manual handling; PECVD of TEOS to the backside of the quartz wafer, as automatic handling during this procedure may scratch the front surface, any scratching is confined to the titanium layer; finally, the frontside titanium is removed by wet etching, which is highly selective and which will not affect the underlying quartz wafer. The TEOS layer protects the backside titanium during wet etching of the frontside titanium. These, or similar scratch protection, steps are required as part of the method of the invention, as conventional silicon processing tools may be used therein, however, conventional silicon processing tools are not usually designed to protect the back, or lower, surface of a silicon wafer, as is required for the optical reticles produced by the method of the invention, thus, additional process steps are required in the method of the invention to prevent damage to the quartz wafer by conventional silicon processing tools.

Silicon-rich oxide (SRO) ($Si_xO_y$) is next deposited onto the top surface of the substrate, patterned, and etched 16. Patterning and etching SRO provides an initial microlens pattern. The SRO layer is a critical key to the resultant grayscale property of the photomask. The transmission of the light used to expose other substrates with this grayscale photomask has the property of attenuation of the intensity when passing through the SRO layer. The attenuation is subject to Beer's Law, where the light intensity of the output, I, after passing through the SRO layer is attenuated from the input light intensity, $I_o$ according to the formula:

$$I=I_o*\exp(-\alpha d),$$

where $\alpha$=the extinction coefficient with a dimension of 1/distance, where d is the thickness of a film.

The SRO is coated with photoresist, patterned and etched to form a recess pattern 18. This step removes a predetermined amount of the SRO film, by either wet or dry etching. The amount of SRO which is removed is replaced by the same thickness of an opaque film in the patterned areas. This step may or may not be used. The purpose of this step is maintain a uniform height across the top surface of the processed quartz wafer, which is critical to the fabrication of the grayscale reticle of the method of the invention.

A layer of an opaque film is deposited over the SRO, patterned and etched 20. In the preferred embodiment, a layer of titanium is deposited to a thickness equivalent to the amount of SRO etched in the step 18. Patterning an opaque film in the recessed areas allows the definition of the patterning areas, alignment marks, mask identification, etc. The opaque film can be any opaque film such as Ti, TiN, Al, Cr, CrO, Cu, Pd or Pt, and their oxides. Usually a metallic film is used. As previously noted, the thickness of the opaque film is equal to the amount of SRO removed by the previous recess etch step.

A planarizing layer is deposited 22, which, in the preferred embodiment, is a layer of $SiO_xN_y$, which is partially removed during a subsequent CMP step. The real component of the film's refractive index should match that of the SRO. The extinction coefficient should be zero. If there is not a match of the real part, two things happen which are detrimental to the final microlens array. The first is a loss of control over the transmittance due to reflection and interference effect, and the second is refraction, which occurs because of the SRO's shape. This refractive effect will alter the radiative intensity pattern at the imaging plane at the surface of the photoresist. Control over the local exposure intensity is a critical factor in order to render the method of the invention commercially viable.

As the $SiO_xN_y$ deposition is a PECVD conformal type of deposition, wherein the $SiO_xN_y$ refractive index may be fine-tuned, and wherein the top surface of the processed quartz wafer is not planar and follows the contour of the SRO pattern. A CMP step 24 is performed to substantially planarize the top surface.

The quartz wafer is cut to size 26, and thus transformed from a round wafer to a rectangular shape. The rectangular piece is bonded to a blank reticle substrate. This process step inherently generates particulates. A diamond saw blade is used to physically cut the quartz substrate. The substrate must be thoroughly cleaned, as a simple rinse with water and a drying step will not provide sufficient cleaning. Should any particles remain on the substrate, the particles will later be printed as defects coming from the photomask.

If scratch protection was applied to the quartz wafer, any remaining scratch protection on the bottom of the quartz wafer is removed 28, in a chemical removal step, which removes the scratch protection and cleans the final surfaces of the bonding part of the reticle. Both sides of the rectangular quartz substrate must be defect free prior to the bonding step.

The final step in the method of the invention is a bonding step 30. A necessary pre-bond cleaning is performed on both the rectangular quartz substrate and the reticle blank. After cleaning, these two pieces are aligned to each other and then bonded. Any particle which may remain between the pieces will prevent bonding of the two surfaces, as the two surfaces must not be physically separated from one another. Insufficient bonding will result in the appearance of Newton rings when viewed with the naked eye. The presence of Newton rings will adversely affect the ability to control the aperture intensity at the photoresist plane since interference effects are present.

Mature IC processes are used to make the grayscale reticle. The last step of the process is the bonding of the diced quartz wafer to a reticle blank and is shown in FIGS. 2 and 3. A quartz reticle blank 32 is prepared. A quartz wafer 34 (shown bonded in FIG. 2) has a microlens array 36 formed thereon. A bonding agent is shown between lens array 36 and blank 32. An outer field 38 contains fiducials 40. A non-active area 42 surrounds active areas 44, and has data labels 46 formed thereon. A plate label 48 is formed in outer field 46.

A description of the steps of the method of the invention with depiction of the structure being fabricated is shown in FIGS. 4-7. A conventional reticle 50 is provided, which is used to expose the SRO layer 52 on the quartz wafer 53, forming a parent reticle, which is subsequently diced and bonded to a reticle blank 54. The final microlens array if on/with a CMOS or CCD wafer 56.

Pattern Design onto a Conventional Reticle

A typical photolithographic stepper used in fabricating semiconductor devices, and in the method of the invention, is a 5× reduction stepper, exposing with the Hg i-line (365 nm). The grayscale reticle is intended for use on the same stepper, thus, the microlens array dimension is determined by the lens pitch of the parent reticle, which is effectively 25× the desired pitch on the targeted CCD or CMOS image sensor. The current generation of image sensors may have a pitch, or unit cell size, of 2 μm×2 μm, or a pitch of 50 μm on the parent reticle and a pitch of 10 μm on the grayscale mask. The parent reticle includes a number of arrays, all having the same 50 μm pitch, but containing circles of varying diameters. An array of a particular sized circle diameter is defined as a zone. To generate a grayscale mask, a number of zones are patterned onto the SRO layer, each zone defining a different thickness of the SRO. In order to achieve smooth microlens shapes when using the grayscale mask of the method of the invention, a sufficient number of zones is needed to ensure that the difference in diameters between any two sequentially used zones is less than the resolution of the stepper. For example: At the CMOS or CCD wafer, given a unit cell size=2 μm×2 μm and an aligner subresolution of 0.2 μm yields, along the diagonal:

(SQRT(2) μm)/(0.2 μm/zone)=7 zones

Therefore, on the grayscale reticle, there is a zone separation of 1um/zone, and furthermore, on the conventional reticle, there is a zone separation of 5 μm/zone.

Figure 8:
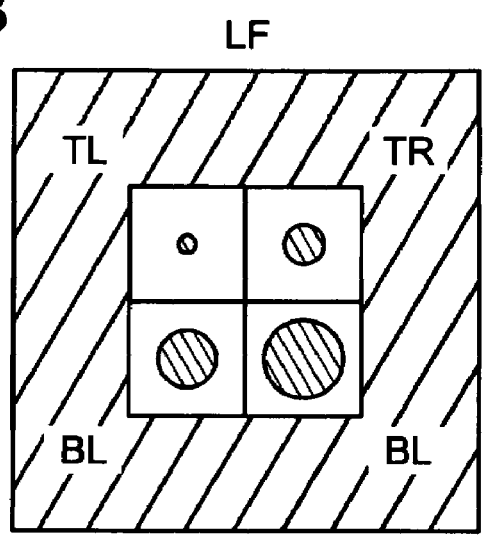
FIGS. 8 and 9 depict two conventional reticles, having reverse polarity from one another.
Figure 9:
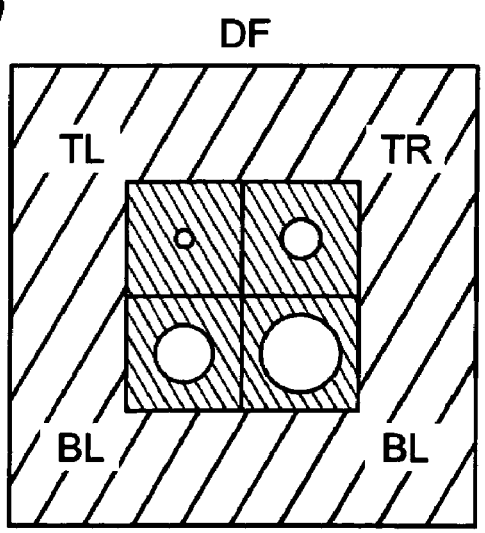

Two examples, one a light field, LF, and the other a dark field, DF, of a four zone pattern layout on the conventional reticle are depicted in FIGS. 8 and 9, which depict two conventional reticles, as required for a four zone pattern layout, having reversed polarity from each other, respectively. Each zone depicted in FIGS. 8 and 9 represent large arrays of circles, all of the same size for any given zone.

Expose the Quartz Wafer Using the Conventional Reticle

Figure 10:
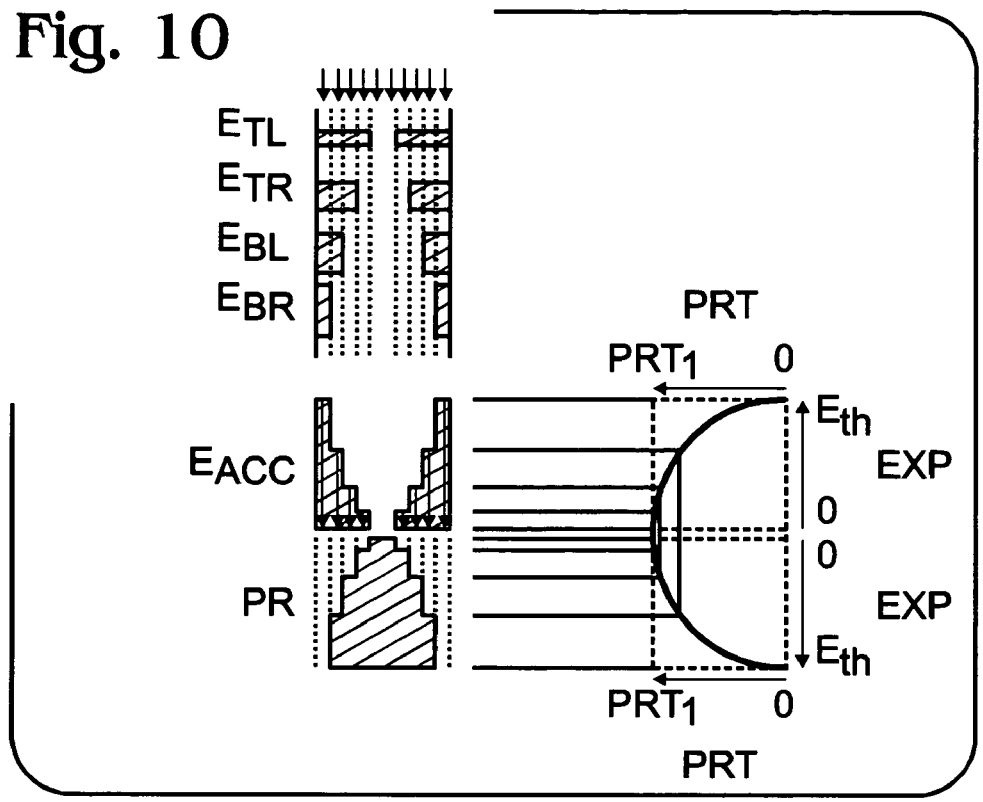
FIGS. 10 and 11 depict photoresist exposure profiles for FIGS. 8 and 9, respectively.
Figure 11:
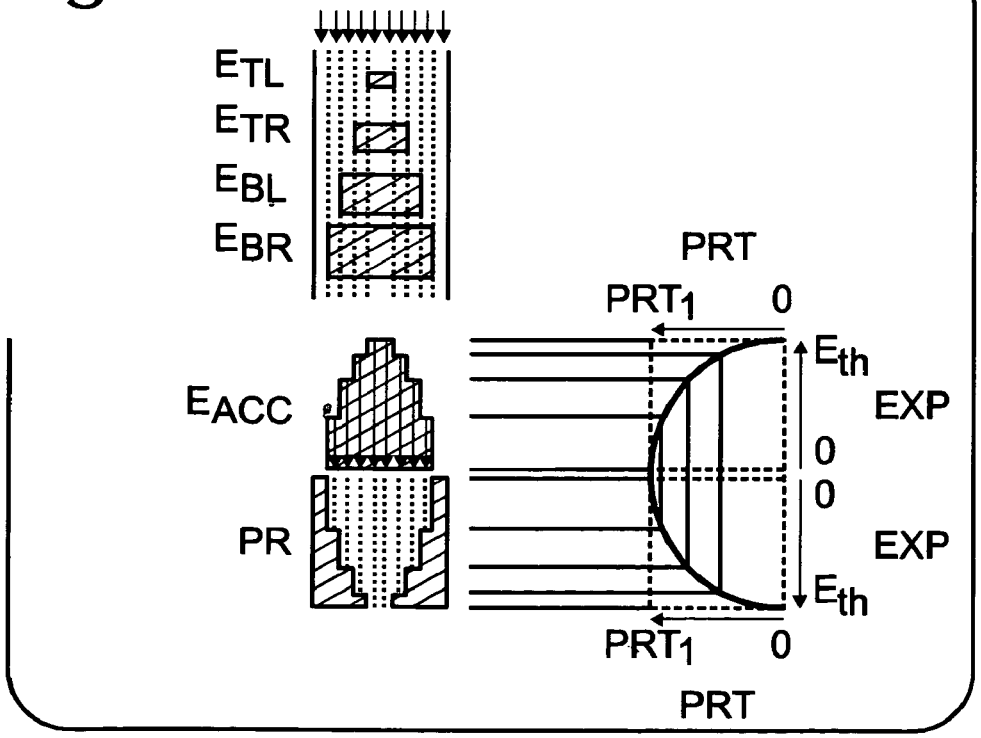

Referring now to FIGS. 10 and 11, the exposure step is depicted, wherein the middle portion of the wafer is subjected to exposures, designated by $E_{TL}$, $E_{TR}$, $E_{BL}$ and $E_{BR}$, which depict four separate exposure doses at the quartz wafer plane of FIGS. 8 and 9, respectively. Step-over lithography is used in that all the individual exposures are super-positioned concentrically. The $E_{ACC}$ graph in FIGS. 10 and 11, depict the accumulated exposure dose at the quartz wafer plane. The section in each of FIGS. 10 and 11, designated by the mirrored PRT vs EXP graph, is a photoresist response curve to the exposing light. This is used for the determination of the appropriate doses to use. Finally the PR graph in FIGS. 10 and 11 depict the photoresist profile after exposure and development. $PRT_i$ is the initial photoresist thickness prior to exposure.

The photoresist response curve is used to determine the individual exposures by working backward from the desired photoresist profile. The use of the photoresist response curve has a direct correlation between the photoresist tier heights and the exposure dose. It is helpful to have as broad of a curve as possible in the exposure axis, the broader the curve the more accurate the correlation between the exposure and the resultant photoresist tier heights.

Expose a CCD or CMOS Wafer or other Substrate Using the Grayscale Photomask

Once the grayscale is fabricated, it is used to pattern a microlens array directly in the photoresist. This patterning may then be etch-transferred to an underlaying film for use in the fabrication of microlens arrays.

Figure 12:
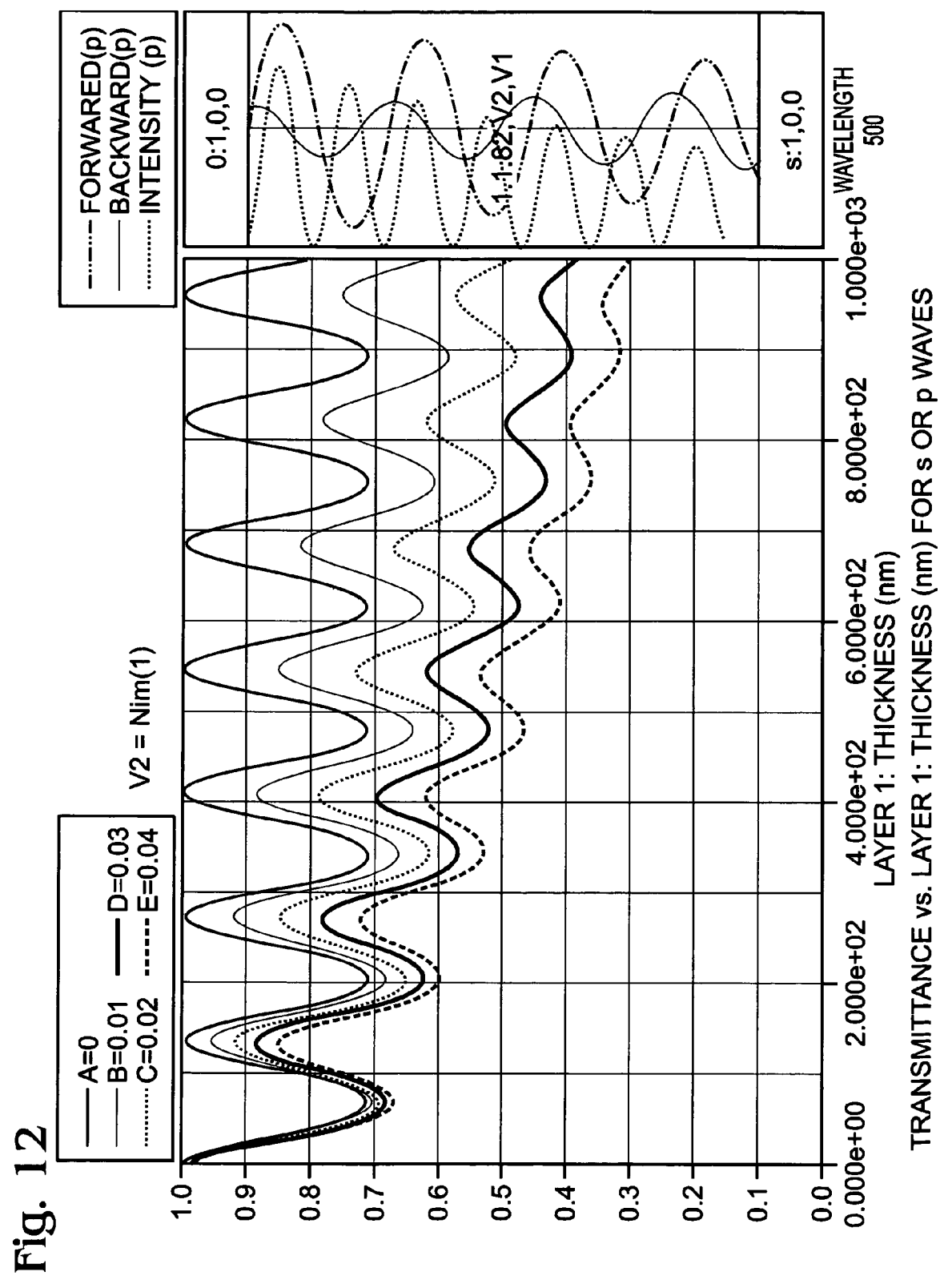

FIG. 12 is a graph of the transmittance vs. SRO film thickness for various k-values, where k is the imaginary component of the complex number for a refractive index, varying from 0 to 0.04/nm in 0.01/nm steps and represents curves A-E, respectively. The SRO in the graph has air on both sides.

Notice curve A has no damping of intensity, being a sinusoidal curve due to the interference effect of film thickness. Notice that curve E has the most damping, having the highest value of k. An exponential damping of the transmittance is coupled with a sinusoidal interference function of the SRO thickness.

Figure 13:
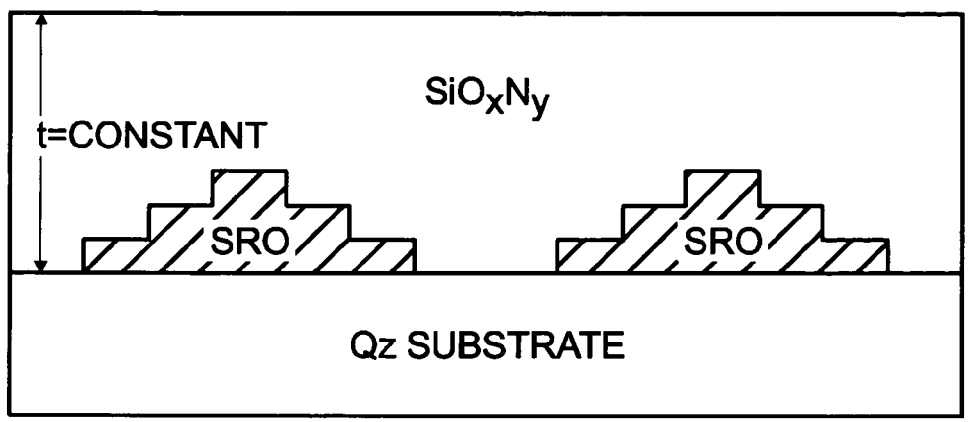
FIG. 13 depicts a filmstack.

Because a CMP is necessary prior the bonding step, there is a constant thickness of the sum of the SRO and overlaying $SiO_xN_y$ thicknesses. This is depicted in FIG. 13. This filmstack has a constant thickness, t, following the CMP step.

Figure 14:
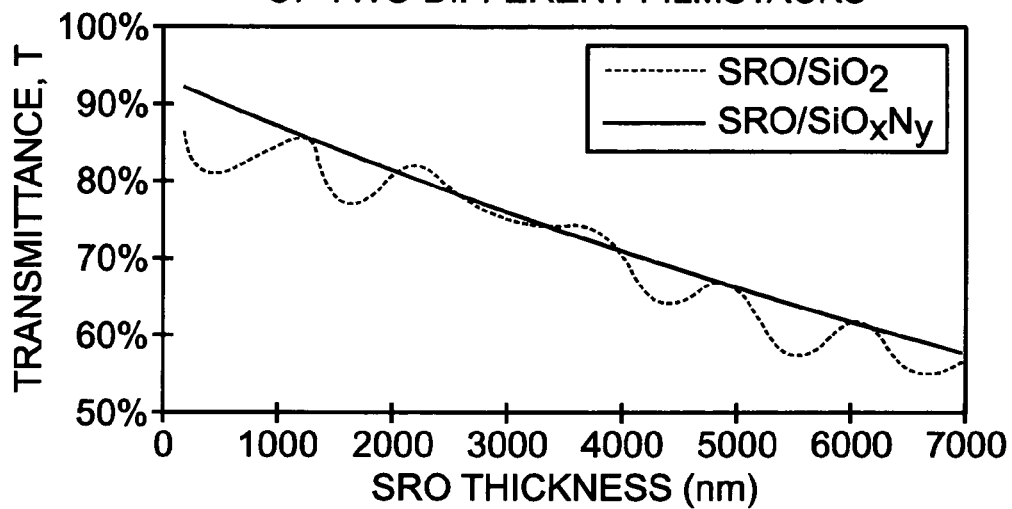
FIG. 14 depicts transmittance v. SRO thickness of two different filmstacks.

The optical path is through the filmstack depicted in FIG. 13. When a non-absorbing film, such as $SiO_xN_y$, or $SiO_2$, whose extinction coefficient equals zero, is used as the top film in the filmstack, attention must be made to match the real part of the index of refraction to that of SRO. When this occurs there will be no oscillations in the transmittance through the filmstack because of a lack of interference effects as the filmstack has a constant thickness. To illustrate this point, the graph of FIG. 14 shows the transmittance, T, versus the SRO thickness for $SiO_xN_y$ and $SiO_2$. The curves are derived from the following formula for the filmstack thickness, $t_{filmstack}$:

$$t_{filmstack} = t_{SRO} + t_{SiOxNy} = c$$

or $$t_{filmstack} = t_{SRO} + t_{SiO2} = c,$$

where c is a constant value.

Figure 15:
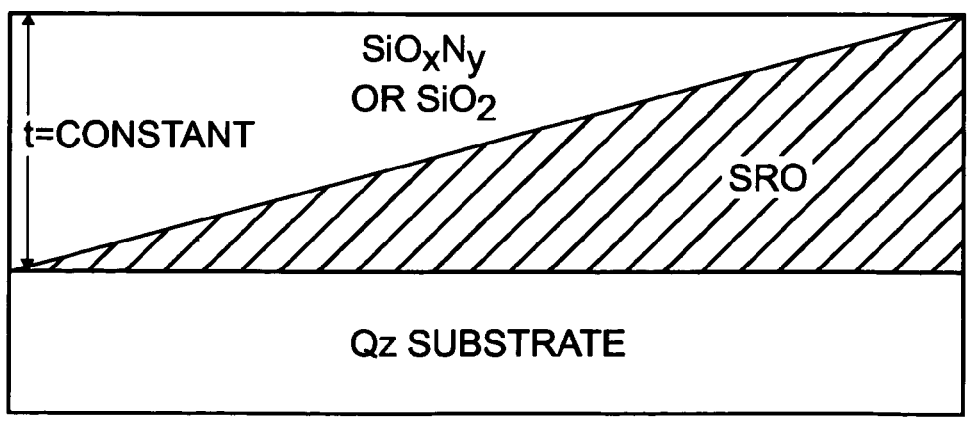
FIG. 15 depicts the relationship of the relative thickness of SRO to $SiO_xN_y$ or $SiO_2$.

FIG. 15 depicts application of the above formula as used in the calculation of the transmittance vs SRO thickness shown in FIG. 14. Note that the filmstack is kept to a constant value. It is therefore essential that the overlaying film, on top of the SRO film, be index-matched to provide adequate control over the dosage of exposing light when using the grayscale photomask.

Thus, a method for fabricating a grayscale reticle has been disclosed. It will be appreciated that further variations and modifications thereof may be made within the scope of the invention as defined in the appended claims.

We claim:

1. A method of fabricating a grayscale reticle, comprising:
   preparing a quartz wafer substrate;
   depositing a layer of SRO on the top surface of the quartz substrate;
   patterning and etching the SRO to form an initial microlens pattern using step-over lithography;
   patterning and etching the SRO to form a recessed pattern in the SRO;
   depositing an opaque film on the SRO;
   patterning and etching the opaque film;
   depositing and planarizing a planarizing layer, wherein the combination of the SRO and planarizing layer form a filmstack with a constant thickness;
   cutting the quartz wafer into rectangular pieces sized to be smaller than a selected blank reticle;
   bonding the pieces to selected reticle blanks to form a grayscale reticle.

2. The method of claim 1 which includes applying scratch protection to the quartz wafer prior to said depositing SRO.

3. The method of claim 2 which includes removing scratch protection from the quartz wafer prior to said bonding.

4. The method of claim 1 wherein said patterning and etching the SRO to form a recessed pattern in the SRO includes etching a predetermined amount of SRO.

5. The method of claim 4 wherein said depositing an opaque film on the SRO includes depositing an opaque film equal in thickness to the predetermined amount of SRO removed during said patterning and etching the SRO to form a recessed pattern in the SRO.

6. The method of claim 1 wherein said preparing a quartz wafer substrate includes preparing a quartz wafer substrate which has the same physical SEMI standard dimensions as a silicon wafer.

7. The method of claim 1 wherein said depositing an opaque film on the SRO includes depositing a film taken from the group of films consisting of Ti, TiN, Al, Cr, CrO, Cu, Pd, Pt, and their oxides.

8. The method of claim 1 wherein the planarizing layer is formed of a material having a refractive index with a real part matching a refractive index with a real part of the SRO.

9. A method of fabricating a grayscale reticle, comprising:
   preparing a quartz wafer substrate;
   depositing a layer of SRO on the top surface of the quartz substrate;
   patterning and etching the SRO to form an initial microlens pattern using step-over lithography;
   patterning and etching the SRO to remove a predetermined amount of SRO;
   depositing an opaque film of the SRO;
   patterning and etching the opaque film;
   depositing and planarizing a planarizing layer having a thickness equal to the predetermined amount of SRO removed, wherein the planarizing layer is formed of a material having a refractive index with a real part matching a refractive index with a real part of the SRO, and wherein the combination of the SRO and planarizing layer form a filmstack with a constant thickness;
   cutting the quartz wafer into pieces having a size smaller than that of a selected blank reticle;
   bonding the pieces to selected reticle blanks to form a grayscale reticle.

10. The method of claim 9 which includes applying scratch protection to the quartz wafer prior to said depositing SRO.

11. The method of claim 10 which includes removing scratch protection from the quarts wafer prior to said bonding.

12. The method of claim 9 wherein said preparing a quartz wafer substrate includes preparing a quartz wafer substrate which has the same physical SEMI standard dimensions as a silicon wafer.

13. The method of claim 9 wherein said depositing an opaque film on the SRO includes depositing a film taken from the group of films consisting of Ti, TiN, Al, Cr, CrO, Cu, Pd, Pt, and their oxides.

* * * * *